(12) United States Patent
Wang

(10) Patent No.: US 9,460,933 B1
(45) Date of Patent: Oct. 4, 2016

(54) PATTERNING METHOD

(71) Applicant: Powerchip Technology Corporation, Hsinchu (TW)

(72) Inventor: Zih-Song Wang, Nantou County (TW)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 14/816,053

(22) Filed: Aug. 2, 2015

(30) Foreign Application Priority Data

May 15, 2015 (TW) .............................. 104115557 A

(51) Int. Cl.
*H01L 21/311* (2006.01)
*H01L 21/308* (2006.01)
*H01L 21/3065* (2006.01)
*H01L 21/768* (2006.01)
*H01L 21/28* (2006.01)

(52) U.S. Cl.
CPC ..... *H01L 21/3088* (2013.01); *H01L 21/28194* (2013.01); *H01L 21/3065* (2013.01); *H01L 21/3085* (2013.01); *H01L 21/3086* (2013.01); *H01L 21/31144* (2013.01); *H01L 21/76831* (2013.01); *H01L 21/76843* (2013.01)

(58) Field of Classification Search
CPC .................. H01L 21/31056; H01L 21/31058; H01L 21/31144; H01L 21/31127; H01L 21/76831; H01L 21/76843; H01L 21/28194
USPC ........ 438/696, 703, 717, 724, 725, 736, 757
See application file for complete search history.

(56) References Cited

U.S. PATENT DOCUMENTS

| 8,524,605 | B1 | 9/2013 | Chen |
| 2008/0008969 | A1 | 1/2008 | Zhou et al. |
| 2009/0042391 | A1* | 2/2009 | Chen ................... H01L 21/0338 438/692 |
| 2010/0151655 | A1* | 6/2010 | Kim .................. H01L 21/76229 438/424 |

(Continued)

FOREIGN PATENT DOCUMENTS

CN 103594373 2/2014

OTHER PUBLICATIONS

"Office Action of Taiwan Counterpart Application", issued on Apr. 1, 2016, p. 1-p. 4.

*Primary Examiner* — Binh X Tran
(74) *Attorney, Agent, or Firm* — Jianq Chyun IP Office

(57) ABSTRACT

A patterning method is provided. Mask structures including first mask layers and first photoresist layers are formed sequentially on a material layer. A second mask layer covering the mask structures is conformally formed on the material layer. First sacrificed layers are formed between the mask structures. Parts of the second mask layer are removed to expose the first photoresist layers and form first U-shape mask layers. The first photoresist layers and the first sacrificed layers are removed. A third mask layer having first surfaces and second surfaces lower than the first surfaces is conformally formed on the material layer. Second sacrificed layers are formed on the second surfaces. Parts of the third mask layer are removed to expose protrusions of the first U-shape mask layers and form second U-shape mask layers. The material layer is patterned by using protrusions of the second U-shape mask layers as masks.

9 Claims, 15 Drawing Sheets

(56) References Cited

U.S. PATENT DOCUMENTS

| | | | | |
|---|---|---|---|---|
| 2010/0197139 A1* | 8/2010 | Koh | ................... | H01L 21/0337 438/694 |
| 2011/0034004 A1* | 2/2011 | Jang | ................... | H01L 21/3086 438/424 |
| 2011/0269294 A1* | 11/2011 | Koh | ................... | H01L 21/0337 438/424 |
| 2011/0312183 A1* | 12/2011 | Yi | ................... | H01L 21/0337 438/694 |
| 2015/0095857 A1* | 4/2015 | Hsu | ................... | G06F 17/5081 716/52 |
| 2015/0137204 A1* | 5/2015 | Wang | ................ | H01L 27/11524 257/314 |

\* cited by examiner

PATTERNING METHOD

CROSS-REFERENCE TO RELATED APPLICATION

This application claims the priority benefit of Taiwan application serial no. 104115557, filed on May 15, 2015. The entirety of the above-mentioned patent application is hereby incorporated by reference herein and made a part of this specification.

BACKGROUND OF THE INVENTION

1. Field of the Invention

The invention relates to a manufacturing method, and relates particularly to a patterning method.

2. Description of Related Art

Along with a goal for higher integration, semiconductor elements are developing towards miniaturized elements, wherein the size of the semiconductor element needs to be reduced to enhance the integration thereof. In order to reduce the size of the semiconductor element, reducing the line width, reducing the line space and increasing the accuracy of the pattern transferring are problems required to be solved. Improving the lithography process is one of the methods to solve the above problem. A smaller line width or line space may be achieved by existing immersion lithography, however if it is desired to achieve an much smaller line width or line space, then an extreme ultraviolet (EUV) exposure technique is required. However, the above exposure technique cannot be used in mass production and requires high equipment costs.

Self-aligned Double Patterning (SADP) is another method for solving the above problem. By forming a first spacer on a side wall of a mask pattern, then removing the mask pattern and forming a second spacer at a side wall of the first spacer, and lastly removing the first spacer, such that the second spacer is used as a mask for performing a patterning process. By SADP, a line width or line space that is smaller than half of the line width or line space of a typical lithography process may be achieved.

However, in traditional SADP, because the right and left sides of the first spacer are not symmetrical, it causes a situation where the shape of the second spacer is affected by the shape of the first spacer when the second spacer is subsequently formed, such that the asymmetry of the left and right sides of the second spacer is more severe. In this way, when patterning process is performed subsequently by using the second spacer as a mask, a pattern cannot be accurately transferred to the material layer that is to be patterned.

SUMMARY OF THE INVENTION

The invention provides a patterning method such that a pattern may be transferred accurately to a material layer that is to be patterned.

The invention provides a patterning method including the following steps. A material layer is provided. A plurality of mask structures are formed on the material layer, wherein each of the mask structures includes a first mask layer and a first photoresist layer in sequence starting at the material layer. A second mask layer covering the mask structure is conformally formed on the material layer. A first sacrificed layer is formed at least on the second mask layer between the mask structures. A part of the second mask layer is removed to expose the first photoresist layer, so as to form a first U-shape mask layer between the adjacent mask structures. The first photoresist layer and the first sacrificed layer are removed. A third mask layer is conformally formed on the first mask layer and the first U-shape mask layer, wherein the third mask layer has a first surface and a second surface, and the first surface is higher than the second surface. A second sacrificed layer is formed at least on the second surface of the third mask layer. A part of the third mask layer is removed to expose protrusions of the first U-shape mask layer, so as to form a second U-shape mask layer between the protrusions of the first U-shape mask layer. The material layer is patterned by using the protrusions of the second U-shape mask layer as a mask.

According to an embodiment of the invention, in the patterning method described above, a method of patterning the material layer includes the following steps. The protrusions of the first U-shape mask layer and the second sacrificed layer are removed by using the protrusions of the second U-shape mask layer as a mask. The second U-shape mask layer located between the protrusions of the second U-shape mask layer, the first mask layer, the first U-shape mask layer and the material layer not covered by the protrusions of the second U-shape mask layer are removed.

According to an embodiment of the invention, in the patterning method described above, a method of forming the mask structures on the material layer includes the following steps. A first mask material layer and the first photoresist layer are formed in sequence on the material layer. A part of the first mask material layer is formed by using the first photoresist layer as a mask.

According to an embodiment of the invention, in the patterning method described above, a material of the first mask layer and a material of the second mask layer are the same.

According to an embodiment of the invention, in the patterning method described above, a material of the third mask layer is different from a material of the first mask layer and a material of the second mask layer.

According to an embodiment of the invention, in the patterning method described above, a shape of the protrusions of the first U-shape mask layer and a shape of the protrusions of the second U-shape mask layer includes a rectangular shape.

According to an embodiment of the invention, in the patterning method described above, a method for forming the first mask layer, the second mask layer and the third mask layer includes chemical vapour deposition or atomic layer deposition respectively.

According to an embodiment of the invention, in the patterning method described above, a method for forming the first sacrificed layer and the second sacrificed layer includes spin coating respectively.

According to an embodiment of the invention, in the patterning method described above, a method for removing the part of the second mask layer and removing the part of the third mask layer includes dry etching respectively.

According to an embodiment of the invention, in the patterning method described above, a method for removing the first photoresist layer, the first sacrificed layer and the second sacrificed layer includes wet etching, dry etching or plasma cleaning respectively.

Based on the above, in the patterning method of the invention, a desired pattern may be transferred accurately to the material layer that is to be patterned by using the protrusions of the U-shape mask layer as a mask.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A to FIG. 2K are cross-sectional schematic diagrams illustrating performing a patterning to a material layer according to another embodiment of the invention.

DESCRIPTION OF THE EMBODIMENTS

FIG. 1A to FIG. 1H are cross-sectional schematic diagrams illustrating performing a patterning to a material layer according to an embodiment of the invention.

Figure 1A:
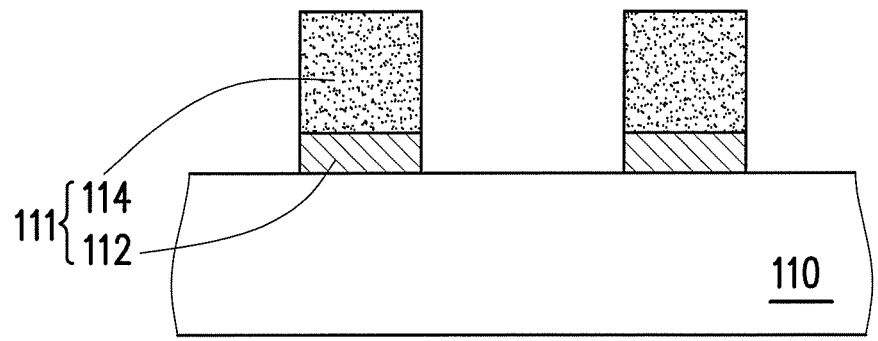
FIG. 1A to FIG. 1H are cross-sectional schematic diagrams illustrating performing a patterning to a material layer according to an embodiment of the invention.

Referring to FIG. 1A, a material layer 110 is provided. The material layer 110, for example, is a substrate or a material layer located on a substrate. The material layer 110, for example, is a silicon substrate, a polysilicon, a metal, a metal silicide, or the like. A method for the material layer 110, for example, is chemical vapour deposition.

A plurality of mask structures 111 are formed on the material layer 110. The mask structure 111 includes a mask layer 112 and a photoresist layer 114 in sequence starting at the material layer 110. A method for forming the mask structure 111, for example, is by first forming a mask material layer (not shown) and the photoresist layer 114 on the material layer 110 in sequence, and then removing a part of the mask material layer by using the photoresist layer 114 as a mask. A method for forming the photoresist layer 114, for example, is by performing a lithography process. A method for forming the mask material layer, for example, is by chemical vapour deposition or atomic layer deposition. A material of the mask material layer, for example, is silicon nitride or silicon oxide. In the present embodiment, the material of the mask material layer, for example, is silicon nitride.

Figure 1B:
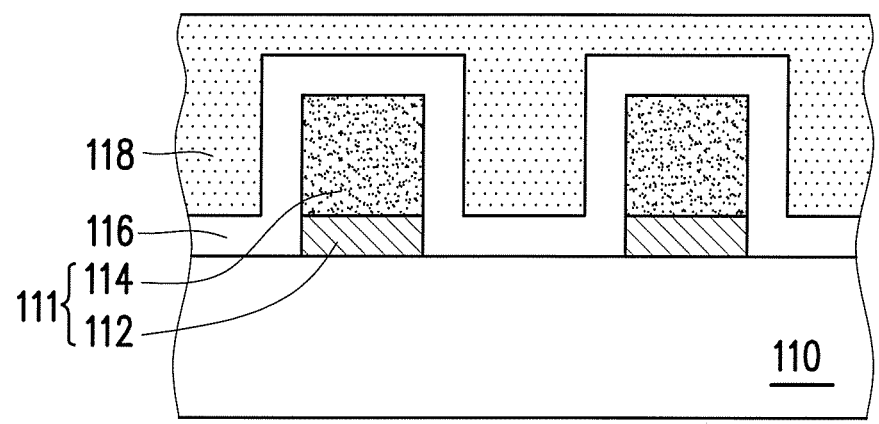

Referring to FIG. 1B, a mask layer 116 covering the mask structure 111 is conformally formed on the material layer 110. The mask layer 116 is formed by, for example, chemical vapour deposition or atomic layer deposition. A material of the mask layer 116, for example, is silicon nitride or silicon oxide, wherein a material of the mask layer 116 and a material of the mask layer 112 may be the same material. In the present embodiment, the material of the mask layer 116, for example, is silicon nitride. When using the atomic layer deposition to form the mask layer 116, the process may be performed at normal or room temperatures, such that the photoresist 114 in the mask structure 111 may be ensured not to decompose or deform easily, which may be caused by a high temperature during the process of forming the mask layer 116 covering thereon. In this way, a desired shape of the mask layer 116 may be maintained, and a desired shape of a U-shape mask layer 120 (refer to FIG. 1C) and a desired shape of a U-shape mask layer 140 (refer to FIG. 1F) that are subsequently formed may also be maintained, such that a desired pattern may be transferred accurately to the material layer 110 that is to be patterned when patterning is performed by using protrusions 142 of the U-shape mask layer 140 as a mask.

A sacrificed layer 118 is formed at least on the mask layer 116 between the mask structures 111. In the present embodiment, the sacrificed layer 118 covers the mask layer 116 entirely, as an example for description. The sacrificed layer 118 is formed by, for example, spin coating. The material of the sacrificed layer 118 may, for example, adopt materials of bottom anti-reflective coating (BARC), such as an organic material.

Figure 1C:
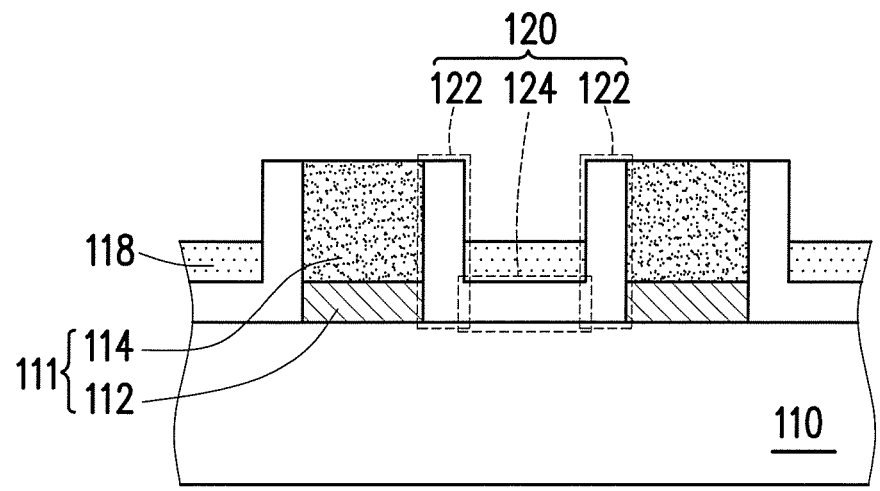

Referring to FIG. 1C, a part of the mask layer 116 is removed to expose the photoresist layer 114, such that the U-shape mask layer 120 is formed between the adjacent mask structures 111. The U-shape mask layer 120, for example, has 2 protrusions 122 and 1 bottom part 124. During the process of removing a part of the mask layer 116, at least a part of the sacrificed layer 118 is removed at the same time. In the present embodiment, there is residual sacrificed layer 118 on the mask layer 116 between the mask structures 111, as an example for description. Therefore, a lower part of the protrusions 122 of the U-shape mask layer 120 and the bottom part 124 of the U-shape mask layer 120 may be protected by the sacrificed layer 118. In the process of removing a part of the mask layer 116 to form the U-shape mask layer 120, even though an upper part of the protrusions 122 of the U-shape mask layer 120 may have few amount of loss, however the shape of the protrusions 122 basically may be maintained in the desired shape, for example close to a rectangular shape. In this way, a desired shape of a U-shape mask layer 140 (refer to FIG. 1F) that is subsequently formed may be maintained, such that a desired pattern may be transferred accurately to the material layer 110 that is to be patterned when patterning is performed by using protrusions 142 of the U-shape mask layer 140 as a mask. A method for removing a part of the mask layer 116 is, for example, dry etching.

Figure 1D:
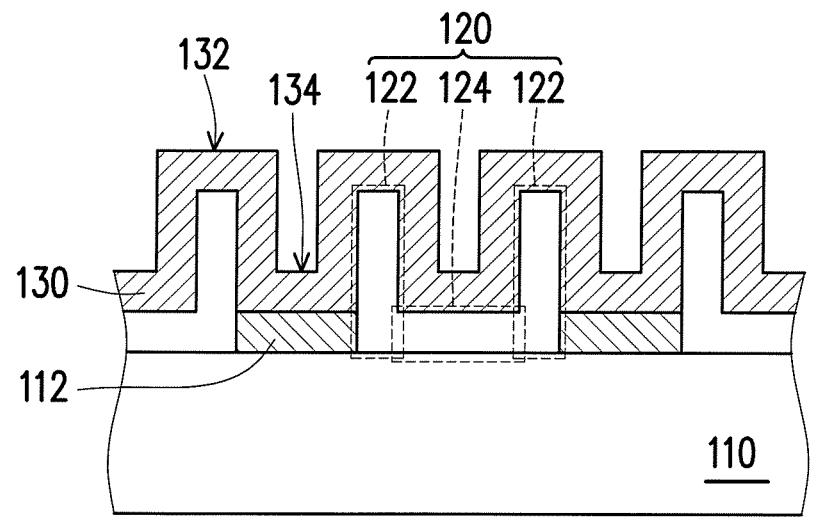

Referring to FIG. 1D, the photoresist layer 114 and the sacrificed layer 118 are removed. A method for removing the photoresist layer 114 and the sacrificed layer 118 is, for example, wet etching, dry etching or plasma cleaning. In the present embodiment, the photoresist layer 114 and the sacrificed layer 118 are removed at the same time as an example for description, but the present invention is not limited thereto. In other embodiments, the sacrificed layer 118 may be removed first and then the photoresist layer 114 removed, or also the photoresist layer 114 may be removed first and then the sacrificed layer 118 removed. A person skilled in the art may determine the order of removing the photoresist layer 114 and the sacrificed layer 118 according to manufacturing requirements.

A mask layer 130 is conformally formed on the mask layer 112 and the U-shape mask layer 120, wherein the mask layer 130 has a surface 132 and a surface 134. A method for forming the mask layer 130 is, for example, chemical vapour deposition or atomic layer deposition and a material of the mask layer 130, for example, is silicon nitride or silicon oxide. The material of the mask layer 130, for example, is different from the material of the mask layer 112 and the material of the mask layer 116. In the present embodiment, the material of the mask layer 130, for example, is silicon oxide.

Figure 1E:
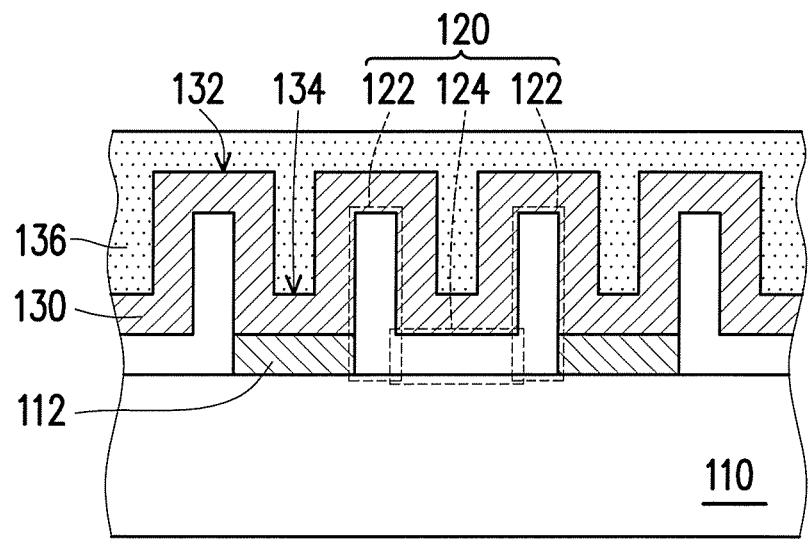

Referring to FIG. 1E, a sacrificed layer 136 is formed at least on the surface 134 of the mask layer 130. In the present embodiment, the sacrificed layer 136 covers the mask layer 130 entirely, as an example for description. A method for forming the sacrificed layer 136, for example, is spin coating. The material of the sacrificed layer 136 may, for example, adopt materials of BARC, such as an organic material.

Figure 1F:
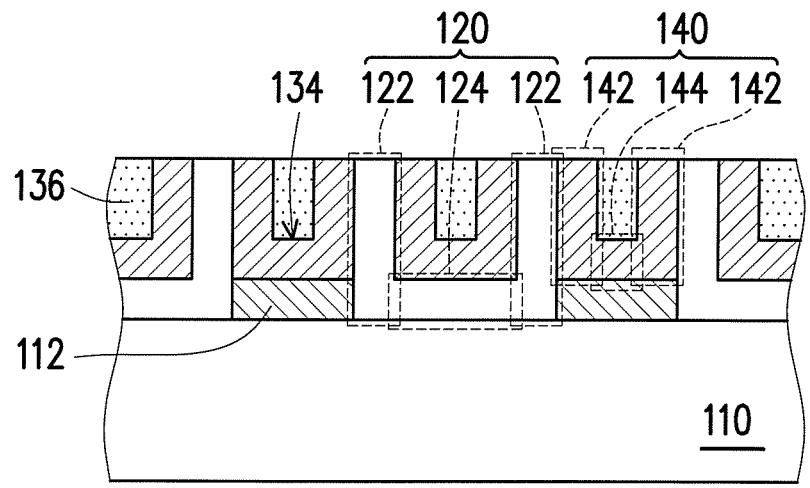

Referring to FIG. 1F, a part of the mask layer 130 is removed to expose the protrusions 122 of the U-shape mask layer 120, such that the U-shape mask layer 140 is formed between the protrusions 122 of the U-shape mask layer 120. The U-shape mask layer 140, for example, has 2 protrusions 142 and 1 bottom part 144. In the process of removing a part of the mask layer 130, at least a part of the sacrificed layer 136 is removed at the same time. In the present embodiment, there is residual sacrificed layer 136 on the surface 134 of the mask layer 130, as an example for description. Therefore, a bottom part of the protrusions 142 of the U-shape mask layer 140 and the bottom part 144 of the U-shape mask layer 140 may be protected by the sacrificed layer 136. In the process of removing apart of the mask layer 130 to form the U-shape mask layer 140, although the upper part of the protrusions 142 of the U-shape mask layer 140 may have few amount of loss, however the shape of the protrusions 142 basically may be maintained in the desired shape, for example close to a rectangular shape. In this way, a desired pattern may be transferred accurately to the material layer 110 that is to be patterned when patterning is performed by using the protrusions 142 of the U-shape mask layer 140 as a mask. A method for removing a part of the mask layer 130, for example, is dry etching.

Figure 1G:
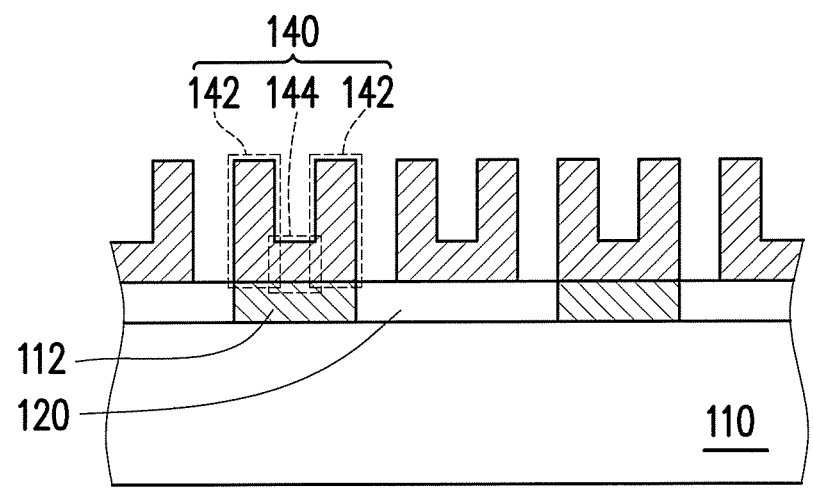

Referring to FIG. 1G, the protrusions 122 of the U-shape mask layer 120 and the sacrificed layer 136 are removed by using the protrusions 142 of the U-shape mask layer 140 as a mask. A method for removing the protrusions 122 of the U-shape mask layer 120, for example, is dry etching. A method for removing the sacrificed layer 136, for example, is wet etching, dry etching or plasma cleaning. In the present embodiment, the protrusions 122 of the U-shape mask layer 120 and the sacrificed layer 136 are removed at the same time, as an example for description, but the present invention is not limited thereto. In other embodiments, the protrusions 122 of the U-shape mask layer 120 may be removed first and then the sacrificed layer 136 removed, and also the sacrificed layer 136 may be removed first and then the protrusions 122 of the U-shape mask layer 120 removed. A person skilled in the art may determine the order of removing the protrusions 122 of the U-shape mask layer 120 and the sacrificed layer 136 according to manufacturing requirements.

Figure 1H:
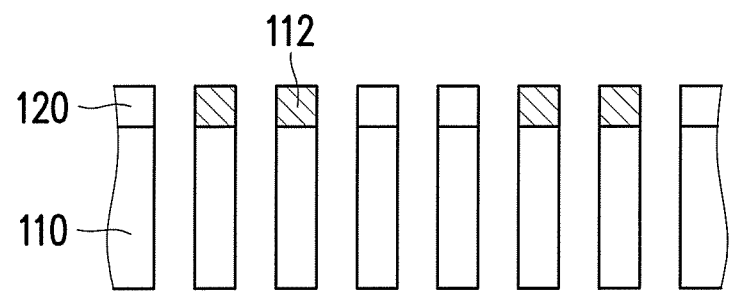

Referring to FIG. 1H, the U-shape mask layer 140 located between the protrusions 142 of the U-shape mask layer 140 (namely the bottom part 144 of the U-shape mask layer 140 in FIG. 1G), the mask layer 112, the U-shape mask layer 120 and the material layer 110 not covered by the protrusions 142 of the U-shape mask layer 140 are removed by using the protrusions 142 of the U-shape mask layer 140 as a mask. A method for removing the U-shape mask layer 140 located between the protrusions 142 of the U-shape mask layer 140, the mask layer 112, the U-shape mask layer 120 and the material layer 110 not covered by the protrusions 142 of the U-shape mask layer 140, for example, is dry etching.

In addition, in the process of removing the mask layer 112, the U-shape mask layer 120 and the material layer 110 not covered by the protrusions 142 of the U-shape mask layer 140, the mask layer 112 and the U-shape mask layer 120 that have undergone patterning also may be used as a hard mask to transfer a pattern to the material layer 110. A part of the mask layer 112 and the U-shape mask layer 120 on the material layer 110 that have undergone patterning may be preserved (as shown in FIG. 1H), or the mask layer 112 and the U-shape mask layer 120 may be removed completely according to requirements of the subsequent processes.

As may be seen from FIG. 1G and FIG. 1H, patterning may be performed on the material layer 110 by using the protrusions 142 of the U-shape mask layer 140 as a mask. However, a method for patterning the material layer 110 is not limited to the method in FIG. 1G and FIG. 1H. As long as the material layer 110 is patterned by using the protrusions 142 of the U-shape mask layer 140 as a mask, it is intended to be within the scope protected by the invention.

In the present embodiment, a width of the mask structure 111 may be set as 3F, a distance between the mask structures 111 may be set as 5F, and a thickness of the mask layer 112, the mask layer 116, the mask layer 130, for example may be set as F, such that a feature size of the pattern transferred on to the material layer 110 is F. Of course, the spirit of the invention is not limited thereto, and the parameters of the above embodiments may be adjusted according to the final line width or line space requirements, for example, the width of each mask structure, the space between each mask structure and the thickness of the mask layer.

Based on the above embodiments, in the above patterning method, a desired pattern may be transferred accurately to the material layer 110 that is to be patterned by using the protrusions 142 of the U-shape mask layer 140 as a mask.

FIG. 2A to FIG. 2K are cross-sectional schematic diagrams illustrating performing a patterning to a material layer according to another embodiment of the invention.

Figure 2A:
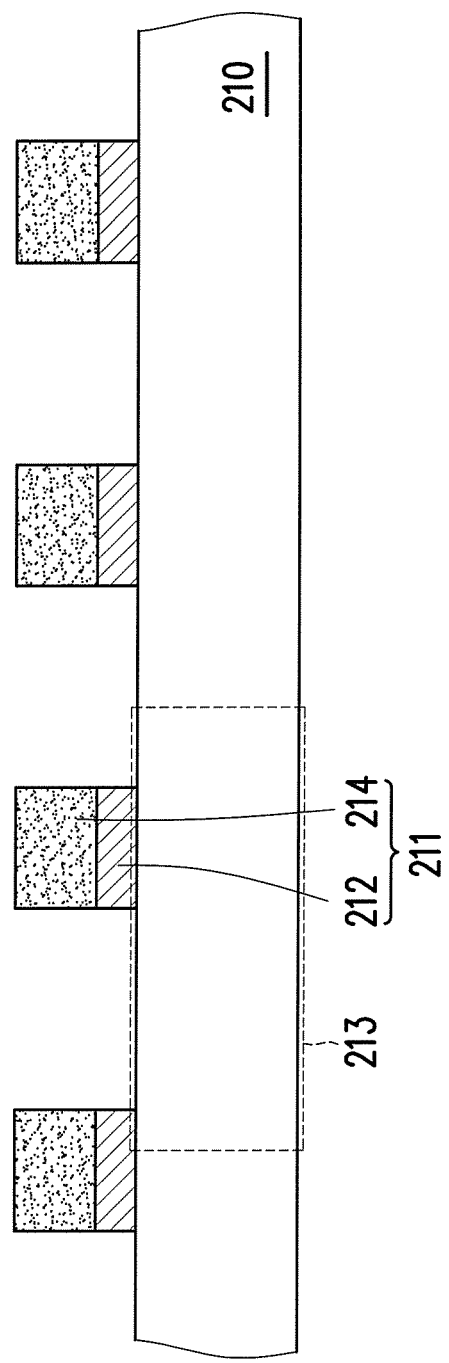

Referring to FIG. 2A, a material layer 210 is provided. The material layer 210, for example, is a substrate or a material layer disposed on a substrate. A material of the material layer 210, for example, is a silicon substrate, a polysilicon, a metal or a metal silicide. The material layer 210 is formed by, for example, chemical vapour deposition.

A plurality of mask structures 211 are formed on the material layer 210. The mask structure 211 includes a mask layer 212 and a photoresist layer 214 in sequence starting at the material layer 210. A pre-reserved area 213 which is framed by the dotted lines in the material layer 210 is the larger area of the material layer 210 which needs to be preserved after the patterning process. A method for forming the mask structures 211, for example, is first forming the mask material layer (not shown) and the photoresist layers 214 on the material layer 210 in sequence, and then removing a part of the mask material layer by using the photoresist layer 214 as a mask. The photoresist layer 214 is formed by, for example, performing a lithography process. The mask material layer is formed by, for example, chemical vapour deposition or atomic layer deposition. A material of the mask material layer, for example, is silicon nitride or silicon oxide. In the present embodiment, the material of the mask material layer, for example, is silicon nitride.

Figure 2B:
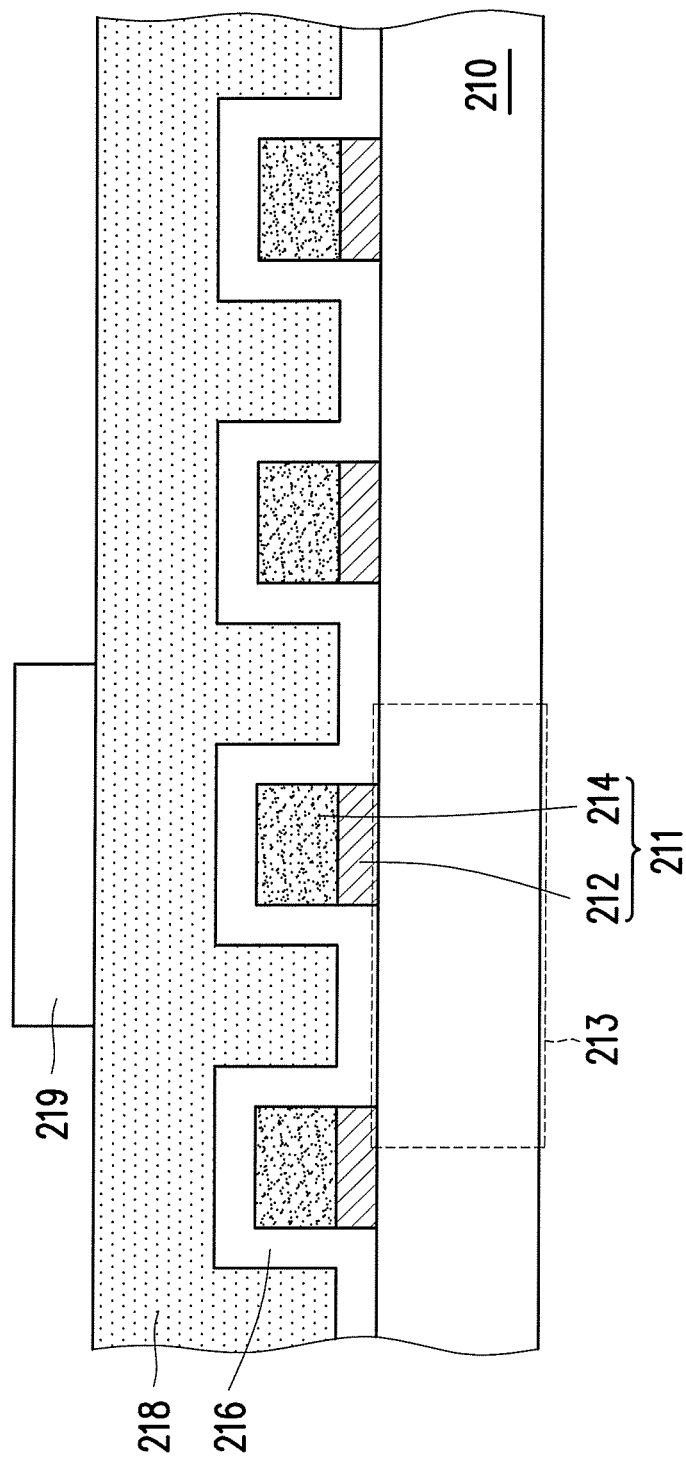

Referring to FIG. 2B, a mask layer 216 covering the mask structure 211 is conformally formed on the material layer 210. A method for forming the mask layer 216 is, for example, chemical vapour deposition or atomic layer deposition. A material of the mask layer 216, for example, is silicon nitride or silicon oxide, wherein a material of the mask layer 216 and a material of the mask layer 212 may be the same material. In the present embodiment, the material of the mask layer 216, for example, is silicon nitride. When using atomic layer deposition to form the mask layer 216, the process may be performed at normal or room temperatures, such that the photoresist 214 in the mask structure 211 may be ensured not to decompose or deform easily, which may be caused by a high temperature during the process of forming the mask layer 216 covering thereon. In this way, a desired shape of the mask layer 216 may be maintained, and a desired shape of a U-shape mask layer 220 (refer to FIG. 2C) and a desired shape of a U-shape mask layer 240 (refer to FIG. 2F) that are subsequently formed may be maintained, such that a desired pattern may be transferred accurately to the material layer 210 when patterning is performed by using protrusions 242 of the U-shape mask layer 240 as a mask.

A sacrificed layer 218 is formed at least on the mask layer 216 between the mask structures 211. In the present embodiment, the sacrificed layer 218 covers the mask layer 216 entirely, as an example for description. A method for forming the sacrificed layer 218, for example, is spin coating and, the material of the sacrificed layer 218 may, for example, adopt materials of BARC, such as an organic material.

A patterned photoresist layer 219 is formed on the sacrificed layer 218, wherein the patterned photoresist layer 219 covers at least the mask structure 211 in the pre-reserved area 213. The patterned photoresist layer 219 is formed by, for example, performing a lithography process.

Figure 2C:
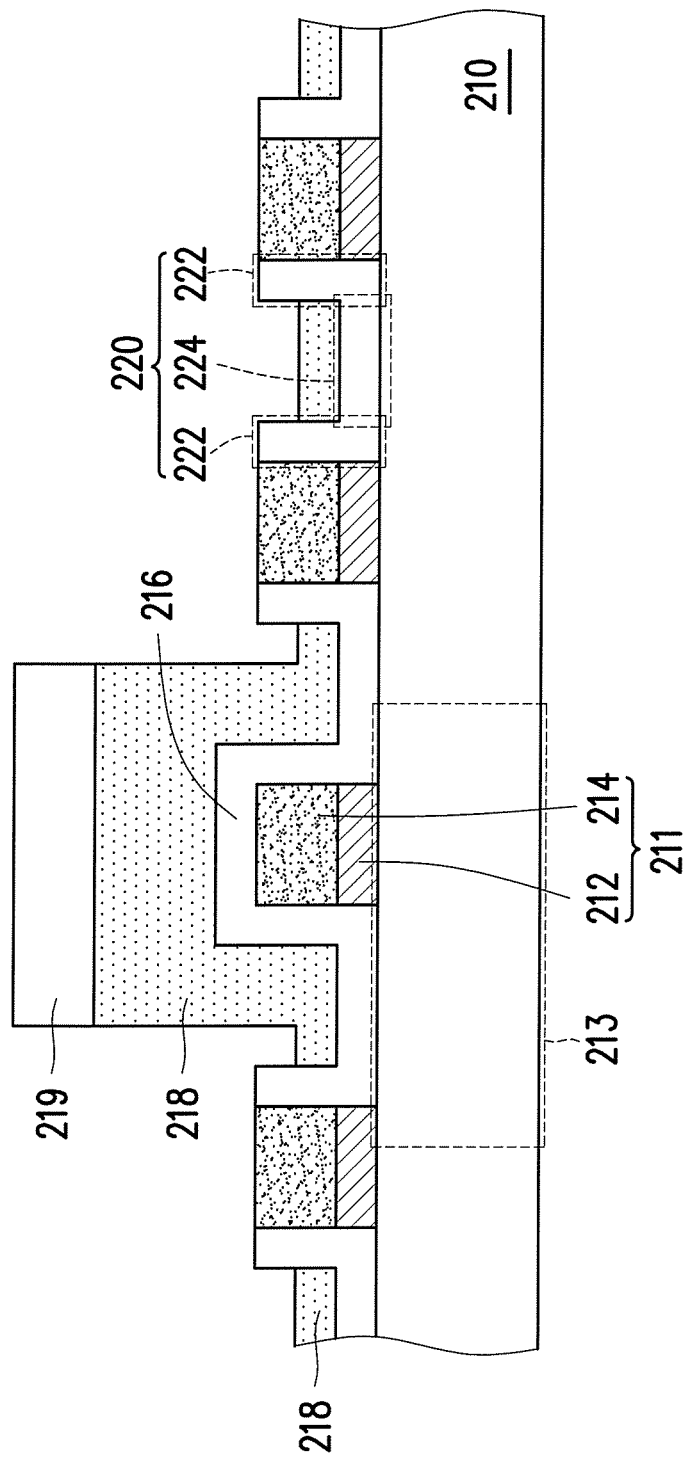

Referring to FIG. 2C, a part of the mask layer 216 is removed so as to expose the photoresist layer 214 by using the patterned photoresist layer 219 as a mask, such that a U-shape mask layer 220 is formed between the adjacent mask structures 211 that are not covered by the patterned photoresist layer 219. The U-shape mask layer 220, for example, has 2 protrusions 222 and 1 bottom part 224. During the process of removing a part of the mask layer 216, at least a part of the sacrificed layer 218 is removed at the same time. In the present embodiment, there is residual sacrificed layer 218 on the mask layer 216 that is between the mask structures 211, and the sacrificed layer 218, the mask structure 211 and the mask layer 216 below the patterned photoresist 219 are preserved, as an example for description. Therefore, a lower part of the protrusions 222 of the U-shape mask layer 220 and the bottom part 224 of the U-shape mask layer 220 may be protected by the sacrificed layer 218. In the process of removing a part of the masking layer 216 to form the U-shape mask layer 220, even though an upper part of the protrusions 222 of the U-shape mask layer 220 may have few amount of loss, however the shape of the protrusions 222 basically may be maintained in the desired shape, for example close to a rectangular shape. In this way, a desired shape of a U-shape mask layer 240 (refer to FIG. 2F) that is subsequently formed may be maintained, such that a desired pattern may be transferred accurately to the material layer 210 that is to be patterned when patterning is performed by using protrusions 242 of the U-shape mask layer 240 as a mask. A method for removing a part of the mask layer 216, for example, is dry etching.

Figure 2D:
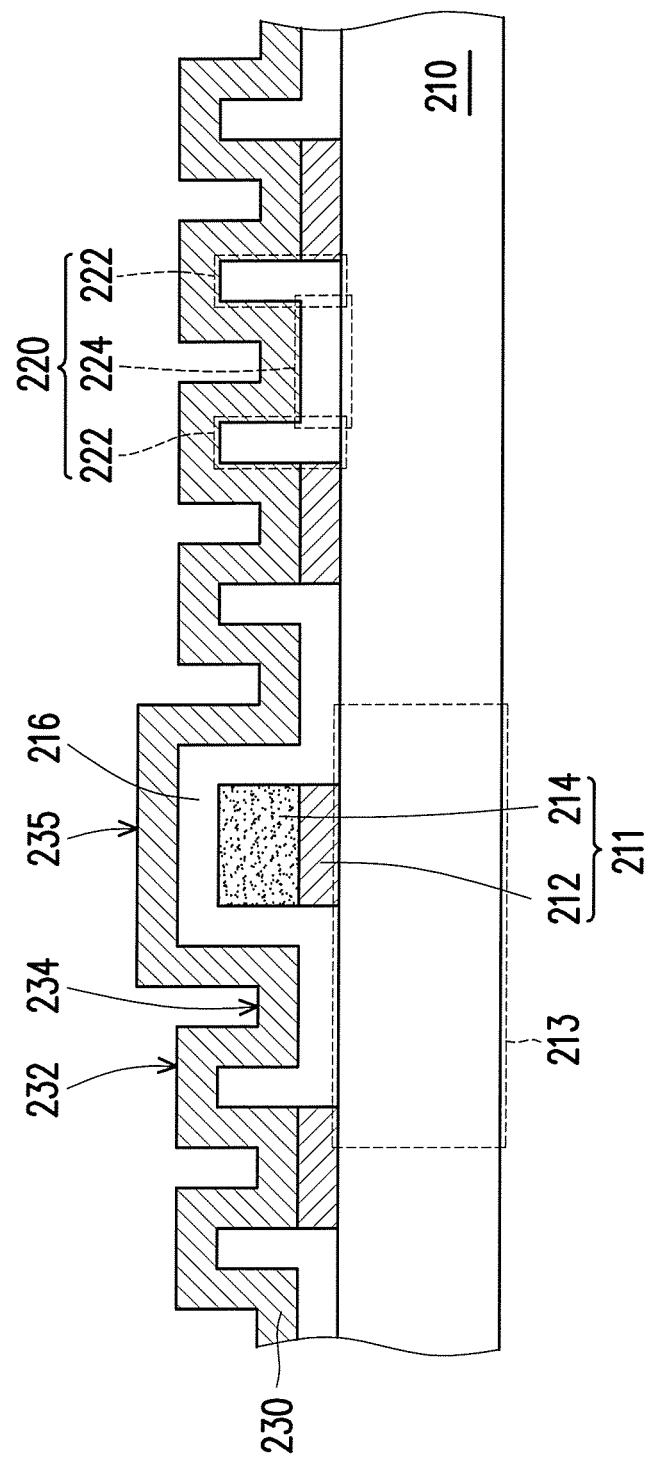

Referring to FIG. 2D, the patterned photoresist layer 219 and the exposed photoresist layer 214 and the sacrificed layer 218 are removed, wherein the photoresist layer 214 in the pre-reserved area 213 receives the protection of the mask layer 216 above so as to not be removed. A method for removing the patterned photoresist layer 219 and the exposed photoresist layer 214 and the sacrificed layer 218, for example, is by wet etching, dry etching or plasma cleaning. In the present embodiment, the patterned photoresist layer 219 and the exposed photoresist layer 214 and the sacrificed layer 218 are removed at the same time as an example for description, however it should not be construed as a limitation to the invention. A person skilled in the art may determine the order of removing the patterned photoresist layer 219 and the exposed photoresist layer 214 and the sacrificed layer 218 according to manufacturing requirements.

A mask layer 230 is conformally formed on the mask layer 212, the mask layer 216 and the U-shape mask layer 220, wherein the mask layer 230 has a surface 232, a surface 234 and a surface 235. The surface 235 is higher than the surface 232, and the surface 232 is higher than the surface 234. The mask layer 230 is formed by, for example, chemical vapour deposition or atomic layer deposition. A material of the mask layer 230, for example, is silicon nitride or silicon oxide. The material of the mask layer 230, for example, is different from the material of the mask layer 212 and the material of the mask layer 216. In the present embodiment, the material of the mask layer 230, for example, is silicon oxide.

Figure 2E:
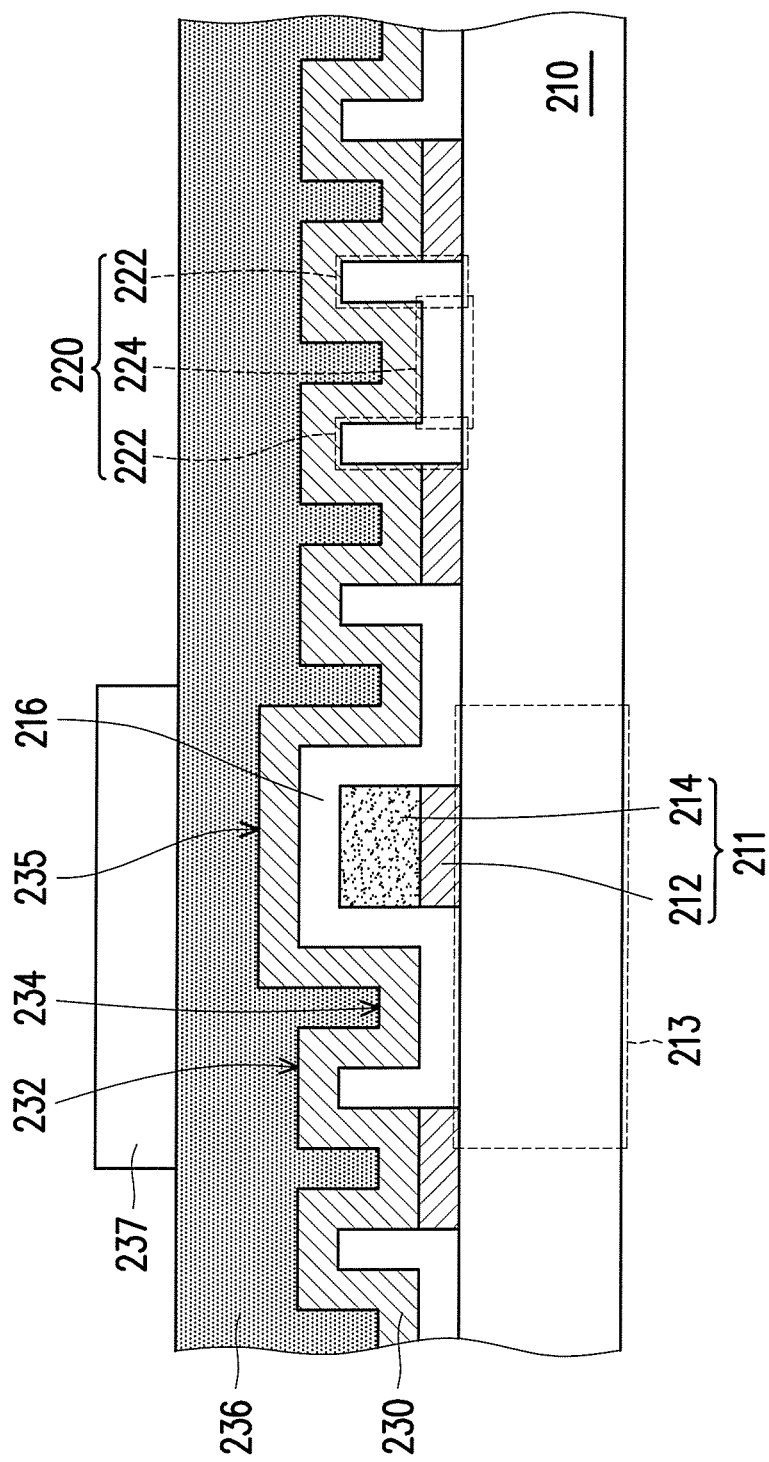

Referring to FIG. 2E, a sacrificed layer 236 is formed at least on the surface 234 of the mask layer 230. In the present embodiment, the sacrificed layer 236 covers the mask layer 230 entirely, as an example for description. The sacrificed layer 236 is formed by, for example, spin coating. The material of the sacrificed layer 236 may, for example, adopt materials of BARC, such as an organic material.

A patterned photoresist layer 237 is formed on the sacrificed layer 236, wherein the patterned photoresist layer 237 covers at least the sacrificed layer 236 that is above the surface 232 of the mask layer 230 in the pre-reserved area 213. The patterned photoresist layer 237 is formed by, for example, performing a lithography process.

Figure 2F:
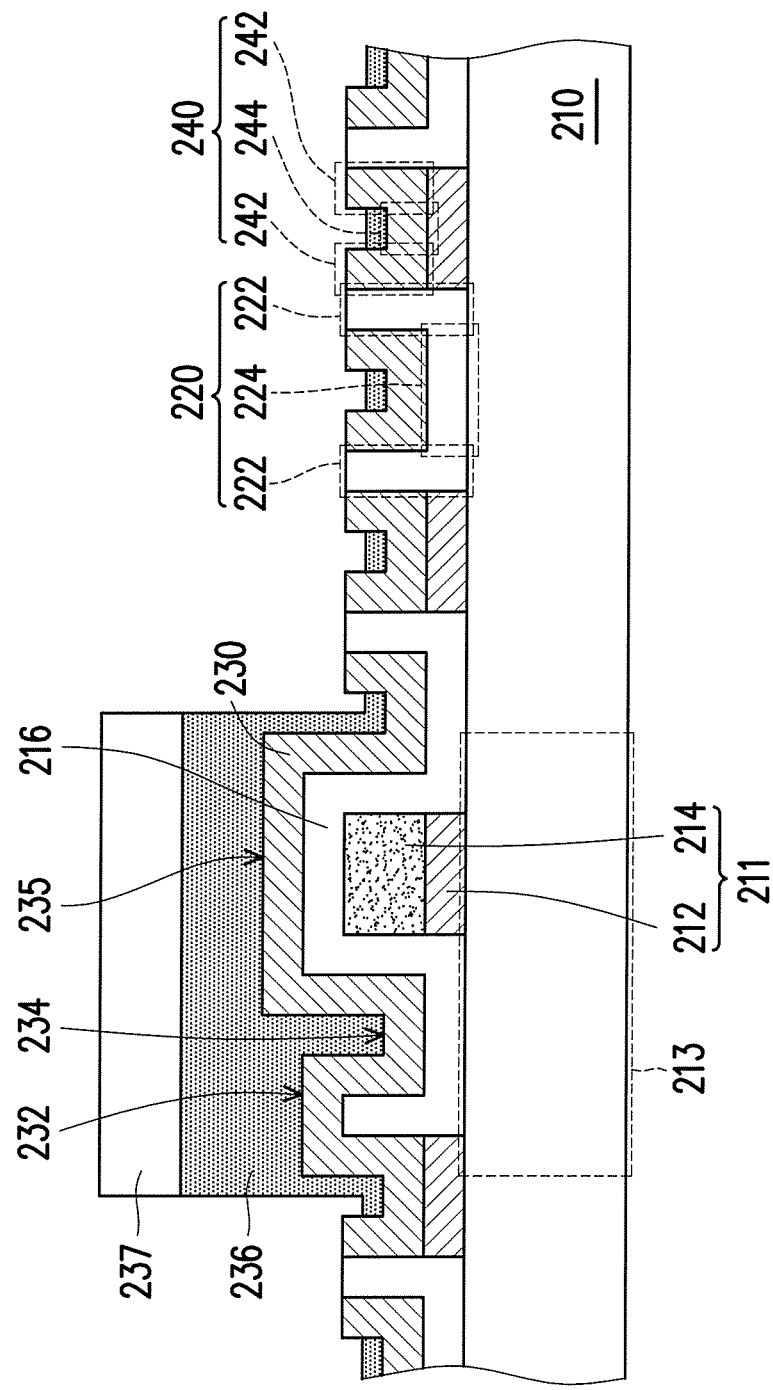

Referring to FIG. 2F, by using the patterned photoresist layer 237 as a mask, a part of the mask layer 230 is removed to expose the protrusions 222 of the U-shape mask layer 220, such that a U-shape mask layer 240 is formed between the protrusions 222 of the U-shape mask layer 220. The U-shape mask layer 240, for example, has 2 protrusions 242 and 1 bottom part 244. During the process of removing the part of the mask layer 230, a part of the sacrificed layer 236 is removed at the same time. In the present embodiment, there is residual sacrificed layer 236 on the surface 234 of the mask layer 230, and the sacrificed layer 236, the mask layer 230, the mask layer 216 and the mask structure 211 that are below the patterned photoresist 237 are preserved as an example for description. Therefore, a lower part of the protrusions 242 of the U-shape mask layer 240 and the bottom part 244 of the U-shape mask layer 240 may be protected by the sacrificed layer 236. In the process of removing a part of the mask layer 230 to form the U-shape mask layer 240, even though an upper part of the protrusions 242 of the U-shape mask layer 240 may have few amount of loss, however the shape of the protrusions 242 basically may be maintained in the desired shape, for example, close to a rectangular shape. In this way, a desired pattern may be transferred accurately to the material layer 210 that is to be patterned when patterning is performed by using the protrusions 242 of the U-shape mask layer 240 as a mask. A method for removing a part of the mask layer 230, for example, is dry etching.

Figure 2G:
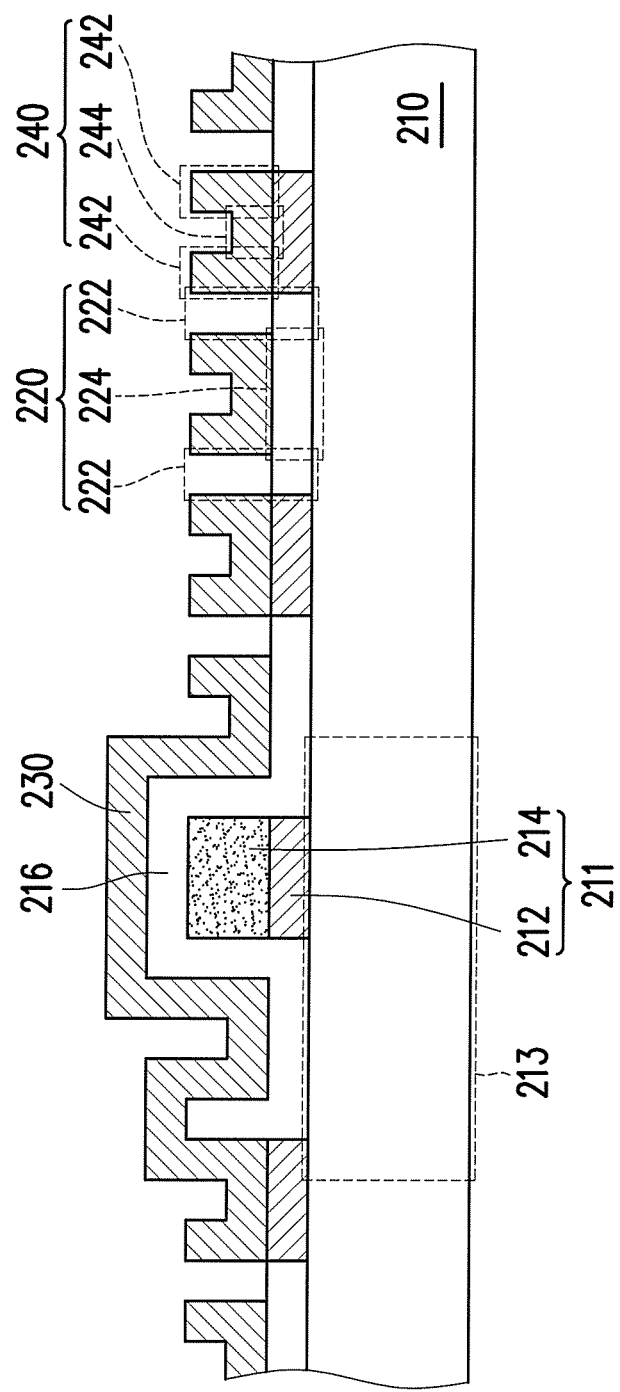

Referring to FIG. 2G, by using the protrusions 242 of the U-shape mask layer 240 as a mask, the exposed protrusions 222 of the U-shape mask layer 220, the patterned photoresist layer 237 and the sacrificed layer 236 are removed. A method for removing the protrusions 222 of the U-shape mask layer 220, for example, is dry etching. A method for removing the patterned photoresist layer 237 and the sacrificed layer 236, for example, is wet etching, dry etching or plasma cleaning respectively. In the present embodiment, the exposed protrusions 222 of the U-shape mask layer 220, the patterned photoresist layer 237 and the sacrificed layer 236 are removed at the same time as an example for description, however it should not be construed as a limitation to the invention. A person skilled in the art may determine the order of removing the exposed protrusions 222 of the U-shape mask layer 220, the patterned photoresist layer 237 and the sacrificed layer 236 according to manufacturing requirements.

Figure 2H:
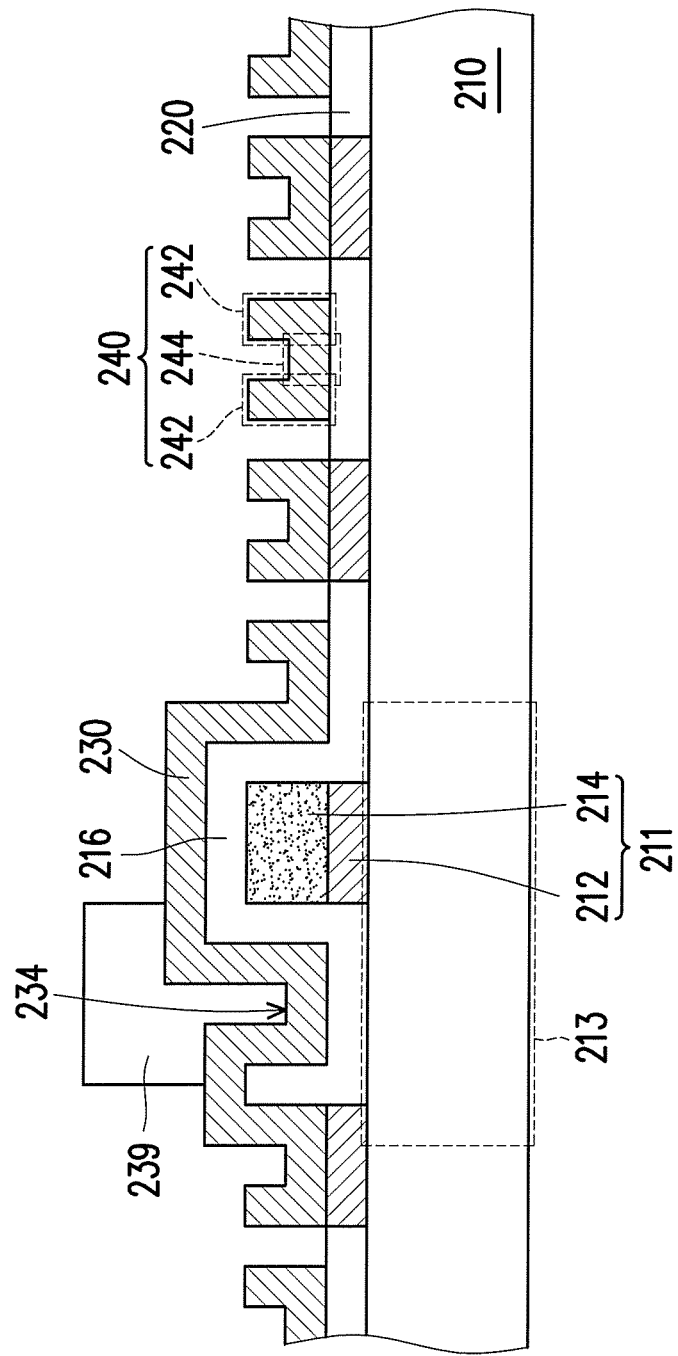
Figure 21:
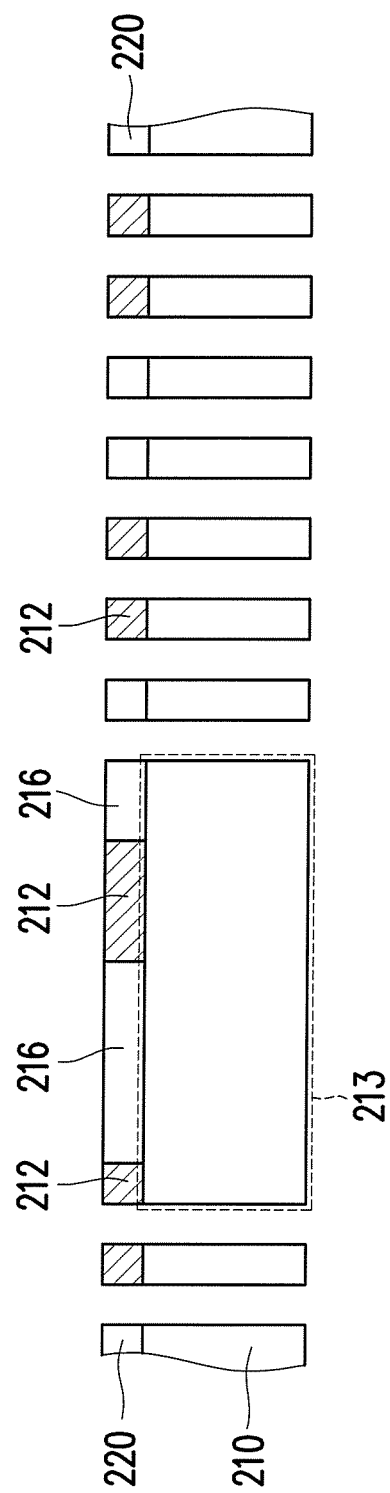

Referring to FIG. 2H, a patterned photoresist layer 239 is formed on the mask layer 230, wherein the patterned photoresist layer 239 covers at least the surface 234 of the mask layer 230 in the pre-reserved area 213. The patterned photoresist layer 239 is formed by, for example, performing a lithography process.

Referring to FIG. 2I, in the areas other than the pre-reserved area 213, by using the protrusions 242 of the U-shape mask layer 240 as a mask, the U-shape mask layer 240 located between the protrusions 242 of the U-shape mask layer 240 (namely the bottom part 244 of the U-shape mask layer 240 in FIG. 2H), the mask layer 212, the mask layer 216, the U-shape mask layer 220 and the material layer 210 not covered by the protrusions 242 of the U-shape mask layer 240 are removed. At the same time, because the material layer 210 in the pre-reserved area 213 has the mask structure 211, the mask layer 216, the mask layer 230 and the patterned photoresist layer 239 on top as a mask, therefore a part of the mask layer 212 and the mask layer 216 are not removed and are preserved. A method for removing the U-shape mask layer 240 located between the protrusions 242 of the U-shape mask layer 240, the mask layer 212, the mask layer 216, the U-shape mask layer 220 and the material layer 210 not covered by the protrusions 242 of the U-shape mask layer 240, for example, is dry etching.

In addition, the mask layer 212, the mask layer 216 and the U-shape mask layer 220 that have undergone patterning may also be used as a hard mask in the process of removing the mask layer 212, the mask layer 216, the U-shape mask layer 220 and the material layer 210 not covered by the protrusions 242 of the U-shape mask layer 240, so as to transfer a pattern to the material layer 110. A part of the mask layer 212, the mask layer 216 and the U-shape mask layer 220 on the material layer 210 that have undergone patterning may be preserved (as shown in FIG. 2I), or the mask layer 212, the mask layer 216 and the U-shape mask layer 220 may be removed completely according to requirements of the subsequent processes.

As may be seen from FIG. 2H and FIG. 2I, patterning may be performed on the material layer 210 by using the protrusions 242 of the U-shape mask layer 240 as a mask. However, a method for patterning the material layer 210 is not limited to the method in FIG. 2H and FIG. 2I. As long as the material layer 210 is patterned by using the protrusions 242 of the U-shape mask layer 240 as a mask, it is intended to be within the scope to be protected by the invention.

In the present embodiment, a width of the mask structure 211 may be set as 3F, a distance between the mask structures 211 may be set as 5F, and a thickness of the mask layer 212, the mask layer 216, the mask layer 230, for example is F, such that a feature size of the pattern transferred on to the material layer 210 is F. Of course, the spirit of the invention is not limited thereto, and the parameters of the above embodiments may be adjusted according to the final line width and line space requirements, for example, the width of each mask structure, the space between each mask structure, the thickness of the mask layer and the width of the patterned photoresist layer.

Figure 2J:
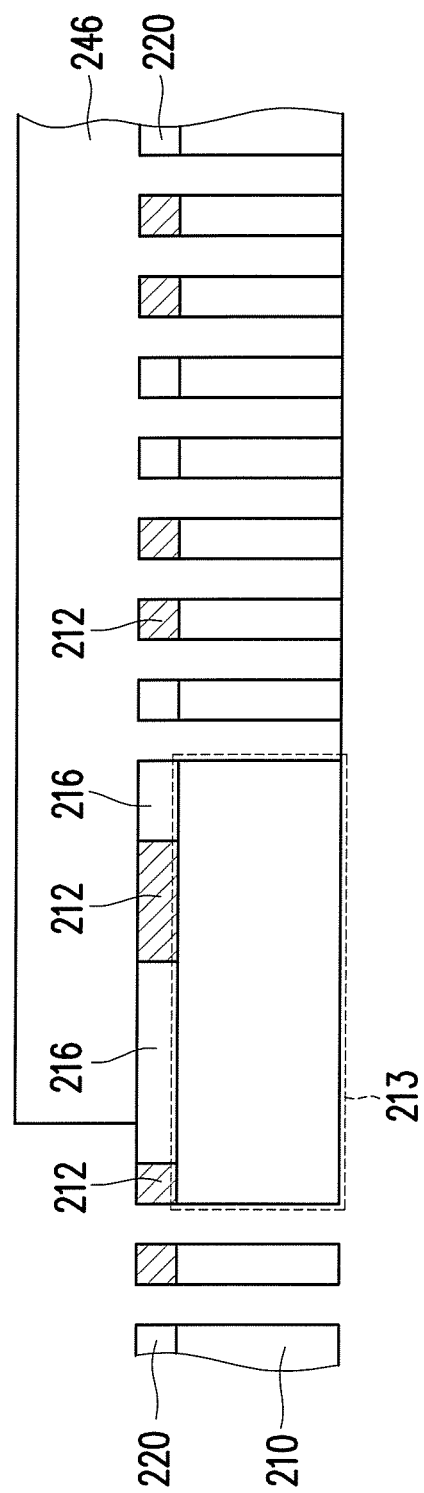
Figure 2K:
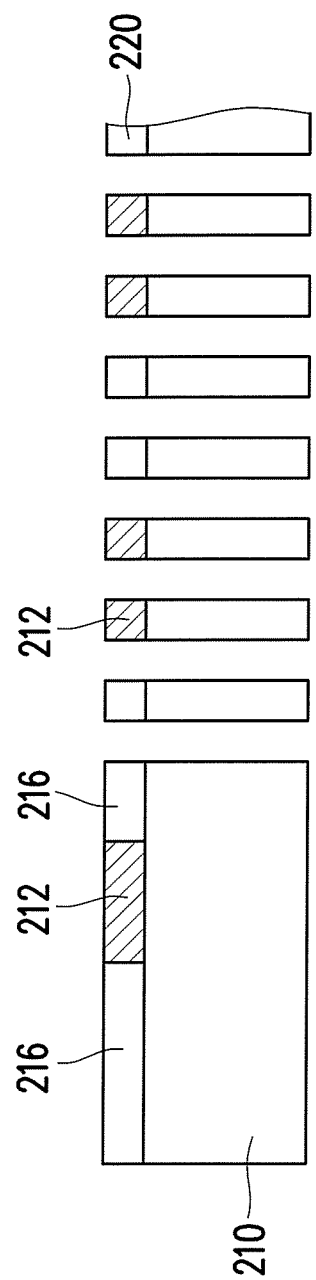

The width of the pre-reserved area 213 may be adjusted by the subsequent lithography and etching processes. Referring to FIG. 2J, the patterned photoresist layer 246 is formed on the material layer 210. The patterned photoresist layer 246 is formed by, for example, performing a lithography process. Referring to FIG. 2K, a portion of the mask layers 212, 216, 220 and a part of the material layer 210 are removed by using the patterned photoresist layer 246 as a mask. A method for removing a part of the material layer 210, for example, is dry etching. The patterned photoresist layer 246 is removed. A method for removing the patterned photoresist layer 246, for example, is wet etching, dry etching or plasma cleaning. The width of the pre-reserved area 213 may be adjusted and a part of the material that is not needed may be removed by the above method.

Based on the above embodiments, in the above patterning method, a desired pattern may be transferred accurately to the material layer 210 that is to be patterned by using the protrusions 242 of the U-shape mask layer 240 as a mask.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A patterning method, comprising:
    providing a material layer;
    forming a plurality of mask structures on the material layer, wherein each of the mask structures comprises a first mask layer and a first photoresist layer in sequence starting at the material layer;
    conformally forming a second mask layer covering the mask structures on the material layer;
    forming a first sacrificed layer at least on the second mask layer between the mask structures;
    removing a part of the first sacrificed layer and a part of the second mask layer to expose the first photoresist layer, so as to form a first U-shape mask layer between the adjacent mask structures;
    removing the first photoresist layer and the first sacrificed layer;
    conformally forming a third mask layer on the first mask layer and the first U-shape mask layer, wherein the third mask layer has a first surface and a second surface, and the first surface is higher than the second surface;
    forming a second sacrificed layer at least on the second surface of the third mask layer;
    removing a part of the second sacrificed layer and a part of the third mask layer to expose protrusions of the first U-shape mask layer, so as to form a second U-shape mask layer between the protrusions of the first U-shape mask layer; and
    removing the protrusions of the first U-shape mask layer and the second sacrificed layer by using the protrusions of the second U-shape mask layer as a mask; and
    removing the second U-shape mask layer located between the protrusions of the second U-shape mask layer, the first mask layer, the first U-shape mask layer and the material layer not covered by the protrusions of the second U-shape mask layer.

2. The patterning method as claimed in claim 1, wherein a method of forming the mask structures on the material layer comprises:
    forming a first mask material layer and the first photoresist layer in sequence on the material layer; and removing a part of the first mask material layer by using the first photoresist layer as a mask.

3. The patterning method as claimed in claim 1, wherein a material of the first mask layer and a material of the second mask layer are the same.

4. The patterning method as claimed in claim 1, wherein a material of the third mask layer is different from a material of the first mask layer and a material of the second mask layer.

5. The patterning method as claimed in claim 1, wherein a shape of the protrusions of the first U-shape mask layer and a shape of the protrusions of the second U-shape mask layer comprise a rectangular shape.

6. The patterning method as claimed in claim 1, wherein a method for forming the first mask layer, the second mask layer and the third mask layer comprises chemical vapour deposition or atomic layer deposition respectively.

7. The patterning method as claimed in claim 1, wherein a method for forming the first sacrificed layer and the second sacrificed layer comprises spin coating respectively.

8. The patterning method as claimed in claim 1, wherein a method for removing the part of the second mask layer and removing the part of the third mask layer comprises dry etching respectively.

9. The patterning method as claimed in claim 1, wherein a method for removing the first photoresist layer, the first sacrificed layer and the second sacrificed layer comprises wet etching, dry etching or plasma cleaning respectively.

\* \* \* \* \*